(12) United States Patent
Masse et al.

(10) Patent No.: US 11,158,794 B2
(45) Date of Patent: Oct. 26, 2021

(54) HIGH-YIELD TUNABLE RADIO FREQUENCY (RF) FILTER WITH AUXILIARY CAPACITORS AND NON-VOLATILE RF SWITCHES

(71) Applicant: Newport Fab, LLC, Newport Beach, CA (US)

(72) Inventors: Chris Masse, Irvine, CA (US); David J. Howard, Irvine, CA (US); Nabil El-Hinnawy, Irvine, CA (US); Gregory P. Slovin, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/773,842

(22) Filed: Jan. 27, 2020

(65) Prior Publication Data

US 2020/0161548 A1  May 21, 2020

Related U.S. Application Data

(63) Continuation-in-part of application No. 16/574,471, filed on Sep. 18, 2019, and a continuation-in-part of
(Continued)

(51) Int. Cl.
*H01L 45/00* (2006.01)
*H03H 11/04* (2006.01)
(Continued)

(52) U.S. Cl.
CPC .......... *H01L 45/1608* (2013.01); *H01L 45/06* (2013.01); *H01L 45/1286* (2013.01); *H01L 45/143* (2013.01); *H01L 45/144* (2013.01); *H01L 45/1675* (2013.01); *H03H 11/04* (2013.01); *H03H 11/1291* (2013.01); *H03J 5/0218* (2013.01)

(58) Field of Classification Search
None
See application file for complete search history.

(56) References Cited

U.S. PATENT DOCUMENTS 2,105,518 A   1/1938   Beers
2,140,770 A   12/1938  Schofield
(Continued)

OTHER PUBLICATIONS

Phase-change RF switches with Robust Switching Cycle Endurance By Moon et al. (Year: 2018).*
(Continued)

*Primary Examiner* — Evren Seven
(74) *Attorney, Agent, or Firm* — Farjami & Farjami LLP

(57) ABSTRACT

A high-yield, tunable radio frequency (RF) filter includes a plurality of process-dependent capacitors and a plurality of non-volatile RF switches. Each of the plurality of process-dependent capacitors is connected to at least one of the plurality of non-volatile RF switches. An auxiliary capacitor in the plurality of process-dependent capacitors is engaged by an ON-state non-volatile RF switch in the plurality of non-volatile RF switches. A primary capacitor in the plurality of process-dependent capacitors is disengaged by an OFF-state non-volatile RF switch in the plurality of non-volatile RF switches. The auxiliary capacitor substitutes for the primary capacitor.

19 Claims, 9 Drawing Sheets

Related U.S. Application Data application No. 16/557,577, filed on Aug. 30, 2019, now Pat. No. 10,862,027, and a continuation-in-part of application No. 16/546,211, filed on Aug. 20, 2019, now Pat. No. 10,756,268, and a continuation-in-part of application No. 16/420,043, filed on May 22, 2019, and a continuation-in-part of application No. 16/418,130, filed on May 21, 2019, and a continuation-in-part of application No. 16/114,106, filed on Aug. 27, 2018, now Pat. No. 10,707,125, said application No. 16/546,211 is a continuation of application No. 16/103,587, filed on Aug. 14, 2018, now Pat. No. 10,461,253, said application No. 16/557,577 is a continuation of application No. 16/103,646, filed on Aug. 14, 2018, now Pat. No. 10,475,993, said application No. 16/574,471 is a continuation of application No. 16/103,490, filed on Aug. 14, 2018, now Pat. No. 10,476,001.

(51) Int. Cl.
*H03J 5/02* (2006.01)
*H03H 11/12* (2006.01)

(56) References Cited

U.S. PATENT DOCUMENTS

| | | | |
|---|---|---|---|
| 2,325,174 A | 7/1943 | Cooper | |
| 2,525,566 A | 10/1950 | Terlecki | |
| 3,496,499 A | 2/1970 | Von Fange | |
| 6,495,998 B1 | 12/2002 | Terreault | |
| 6,535,545 B1 | 3/2003 | Ben-Bassat | |
| 6,750,734 B2 | 6/2004 | Utsunomiya | |
| 6,894,305 B2 | 5/2005 | Yi | |
| 7,761,067 B1* | 7/2010 | Tsai | H03H 7/12 455/127.2 |
| 7,920,414 B2 | 4/2011 | Lowrey | |
| 8,345,472 B2 | 1/2013 | Lee | |
| 8,614,472 B1 | 12/2013 | Islam et al. | |
| 2,014,181 A1 | 7/2014 | Moon | |
| 9,257,647 B2 | 2/2016 | Borodulin | |
| 9,362,492 B2 | 6/2016 | Goktepeli | |
| 9,362,882 B1 | 6/2016 | Madan | |
| 9,368,720 B1 | 6/2016 | Moon et al. | |
| 9,601,545 B1 | 3/2017 | Tu | |
| 10,164,608 B2 | 12/2018 | Belot | |
| 10,461,253 B1 | 10/2019 | Slovin | |
| 10,505,106 B1 | 12/2019 | Joshi | |
| 10,529,922 B1 | 1/2020 | Howard | |
| 2004/0113232 A1 | 6/2004 | Johnson et al. | |
| 2005/0184828 A1 | 8/2005 | Son | |
| 2005/0212090 A1 | 9/2005 | Friedrich et al. | |
| 2007/0080389 A1 | 4/2007 | Petruzzello | |
| 2007/0099405 A1 | 5/2007 | Oliva et al. | |
| 2007/0246766 A1 | 10/2007 | Liu | |
| 2007/0247899 A1 | 10/2007 | Gordon | |
| 2008/0042243 A1 | 2/2008 | Lee et al. | |
| 2008/0142775 A1 | 6/2008 | Chen | |
| 2008/0142777 A1 | 6/2008 | Park | |
| 2008/0272355 A1 | 11/2008 | Cho | |
| 2008/0291718 A1 | 11/2008 | Liu | |
| 2009/0065761 A1 | 3/2009 | Chen | |
| 2009/0108247 A1 | 4/2009 | Takaura | |
| 2009/0115052 A1 | 5/2009 | Treece et al. | |
| 2010/0008127 A1 | 1/2010 | Muraoka | |
| 2010/0237314 A1 | 9/2010 | Tsukamoto | |
| 2010/0238603 A1* | 9/2010 | Chung | H01G 4/33 361/301.4 |
| 2010/0246247 A1 | 9/2010 | Kim | |
| 2011/0002080 A1 | 1/2011 | Ranta | |
| 2011/0002158 A1 | 1/2011 | Muraoka | |
| 2011/0097825 A1 | 4/2011 | Cheng | |
| 2012/0037872 A1 | 2/2012 | Ikarashi | |
| 2014/0110657 A1 | 4/2014 | Redaelli | |
| 2014/0191181 A1 | 7/2014 | Moon | |
| 2014/0327497 A1 | 11/2014 | Gorbachov | |
| 2015/0022938 A1* | 1/2015 | Okada | H01G 4/015 361/278 |
| 2015/0104921 A1 | 4/2015 | Terai et al. | |
| 2015/0249096 A1 | 9/2015 | Lupino | |
| 2016/0056373 A1 | 2/2016 | Goktepeli | |
| 2016/0300612 A1 | 10/2016 | Manipatruni et al. | |
| 2017/0133998 A1 | 5/2017 | Hino | |
| 2017/0187347 A1 | 6/2017 | Rinaldi | |
| 2017/0207764 A1 | 7/2017 | Wang | |
| 2018/0005786 A1 | 1/2018 | Navarro | |
| 2018/0019729 A1 | 1/2018 | Tsukamoto | |
| 2018/0048305 A1 | 2/2018 | Jin | |
| 2018/0122825 A1 | 5/2018 | Lupino | |
| 2018/0138894 A1 | 5/2018 | Belot | |
| 2018/0266974 A1 | 9/2018 | Khosravani | |
| 2019/0088721 A1 | 3/2019 | Reig | |
| 2019/0165264 A1 | 5/2019 | Wu | |
| 2019/0296718 A1 | 9/2019 | Birkbeck | |

OTHER PUBLICATIONS

Moon, et al. "Phase-Change RF Switches with Robust Switching Cycle Endurance," *2018 IEEE Radio and Wireless Symposium (RWS)*, pp. 231-233, Jan. 2018, Anaheim, CA.

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

"Phase-change RF switches with Robust Switching Cycle Endurance" by Moon et al. (IEEE 2018).

"Highly Reconfigurable Aluminum Nitride MEMS Resonator Using 12 Monolithically Integrated Phase Change Material Switches" by Hummel et al. (IEEE 2015).

"Switchable Aluminum Nitride MEMS Resonator Using Phase Change Materials" by Hummel et al. (TRF 2014).

* cited by examiner

HIGH-YIELD TUNABLE RADIO FREQUENCY (RF) FILTER WITH AUXILIARY CAPACITORS AND NON-VOLATILE RF SWITCHES

CLAIMS OF PRIORITY

The present application is a continuation-in-part of and claims the benefit of and priority to application Ser. No. 16/574,471 filed on Sep. 18, 2019, titled "Phase-Change Material RF Switch,", which is in turn a continuation of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/546,211 filed on Aug. 20, 2019, titled "High Reliability RF Switch Based on Phase-Change Material,", which is in turn a continuation of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/557,577 filed on Aug. 30, 2019, titled "Method of Manufacturing PCM RF Switch,", which is in turn a continuation of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is further a continuation-in-part of and claims the benefit of and priority to application Ser. No. 16/418,130 filed on May 21, 2019, titled "Radio Frequency (RF) Filtering Using Phase-Change Material (PCM) RF Switches,". The present application is further a continuation-in-part of and claims the benefit of and priority to application Ser. No. 16/420,043 filed on May 22, 2019, titled "Radio Frequency (RF) Module Using a Tunable RF Filter with Non-Volatile RF Switches,". The disclosures and contents of all of the above-identified applications are hereby incorporated fully by reference into the present application.

BACKGROUND

Radio frequency (RF) devices in semiconductor dies and products may employ filters with capacitors to admit desired frequencies, such as a frequency band corresponding to a selected wireless communication standard, and to reject or suppress undesired frequencies, such as frequency bands corresponding to unselected wireless communication standards. However, capacitors in RF filters exhibit variations associated with factory fabrication, which can result in failure to admit the desired frequencies or reject the undesired frequencies. In these instances, the filter may be incompatible with regulatory requirements related to spurious emissions, or generally unsuitable for its purpose, and the semiconductor die or product may have to be discarded by the factory.

Conventional switches are unsuitable for tuning RF filters since, for example, conventional switches are volatile and do not maintain their states during power off. Once the product utilizing the RF filter, e.g. a mobile phone, is in possession of an end-user, keeping power on at all times would be impractical and would also drain the battery. Conventional switches may also be unreliable and vary over time, and may introduce too much insertion loss.

Further, at radio frequencies, conventional fuses introduce significant electrical resistance, are physically too large, and introduce insertion losses that can prohibit RF filtering as intended. Conventional fuses are also one-time-programmable and cannot be reconfigured or re-used.

Thus, there is need in the art for a tunable RF filtering solution with a low insertion loss that is also non-volatile and reliable, and which can also be reconfigured at will.

SUMMARY

The present disclosure is directed to a high-yield tunable radio frequency (RF) filter with auxiliary capacitors and non-volatile RF switches, substantially as shown in and/or described in connection with at least one of the figures, and as set forth in the claims.

DETAILED DESCRIPTION

Figure 1:
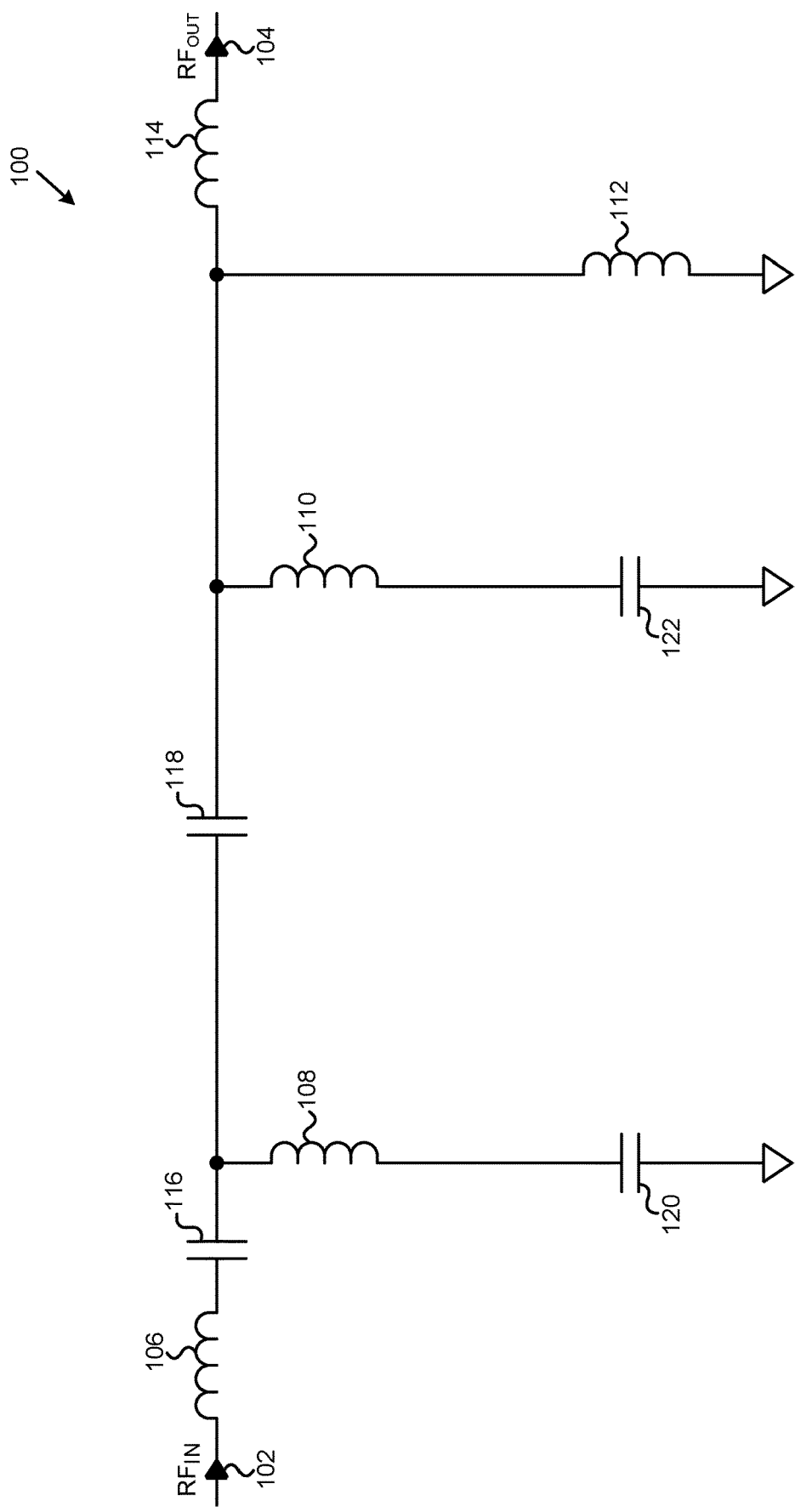
FIG. 1 illustrates a portion of a radio frequency (RF) filter.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions. Further, in the present application the terms "connected" to/with or "coupled" to/with may be used interchangeably to have the same or similar meaning, and each term may mean direct or indirect connection.

FIG. 1 illustrates a portion of a radio frequency (RF) filter. RF filter 100 includes RF input 102, RF output 104, inductors 106, 108, 110, 112, and 114, and capacitors 116, 118, 120, and 122. RF filter 100 receives RF signals at RF input 102. In various implementations, RF input 102 can be coupled to an amplifier, a matching network, a mixer of a transmit chain (not shown in FIG. 1), or to another input source. Inductor 106 is coupled between RF input 102 and capacitor 116. A first terminal of capacitor 116 is coupled to inductor 106 and a second terminal of capacitor 116 is coupled to first terminals of inductor 108 and capacitor 118. A second terminal of capacitor 118 is coupled to first terminals of inductors 110, 112, and 114. A second terminal of inductor 114 is coupled to RF output 104. Capacitor 120 is coupled between inductor 108 and ground. Capacitor 122 is coupled between inductor 110 and ground. And a second terminal of inductor 112 is coupled to ground. FIG. 1 illustrates one possible arrangement of RF filter 100. In various implementations, RF filter 100 can include more or fewer inductors, capacitors, and/or resistors having various values and various arrangements.

RF filter 100 is designed to admit desired frequencies from RF input 102, and to reject undesired frequencies from RF input 102. For example, RF filter 100 can be designed to substantially admit frequencies between approximately 2.1 gigahertz and approximately two 2.5 gigahertz (2.1 GHz-2.5 GHz), and to substantially reject frequencies between approximately 3.3 gigahertz and approximately 5.8 gigahertz (3.3 GHz-5.8 GHz). The desired frequencies may correspond to fundamental frequencies in a wireless communication standard, such as a Bluetooth standard or 802.11 b/g/n WiFi standards. The undesired frequencies may correspond to fundamental frequencies in another wireless communication standard, such as long-term evolution (LTE) standards. In various implementations, RF filter 100 can be designed to admit and/or reject any other frequencies corresponding to any other wireless communication standards, such as a wireless local area network (WLAN) standard, or a 5G standard.

RF filter 100 in FIG. 1 can be implemented in a consumer electronic device that also includes an antenna or an antenna array coupled to RF output 104 for transmitting filtered RF signals. In various implementations, the consumer electronic device can be a mobile phone, a tablet, or another personal wireless communication device. In one implementation, RF filter 100 can be used along with a receive/transmit block, in order to switch between receive and transmit modes.

Due to process variations associated with factory fabrication, RF filter 100 can fail to substantially reject undesired frequencies. Continuing the above example, RF filter 100 may have been designed to substantially admit frequencies between approximately 2.1 GHz and 2.5 GHz, and to substantially reject frequencies between approximately 3.3 GHz and 5.8 GHz. Due to process variations, any of capacitors 116, 118, 120, and 122 may vary up to ±20% from their nominal capacitance. The frequency response of RF filter 100 correspondingly varies. As a result, at RF output 104, RF filter 100 may fail to substantially admit all desired frequencies and/or may fail to substantially reject all undesired frequencies.

As used in the present application, "substantially admitting a frequency" refers to an output RF signal having a high relative power at that frequency. Likewise, "substantially rejecting a frequency" refers to an output RF signal having a low relative power at that frequency. The relative power can be relative to an input power, relative to a normalized power, or relative to a threshold power. For example, RF filter 100 may fail to substantially admit the desired frequencies when RF signals between approximately 2.1 GHz and 2.5 GHz have power below negative two and a half decibels (−2.5 dB) relative to an input power. As another example, RF filter 100 may fail to substantially reject undesired frequencies when RF signals between approximately 3.3 GHz and 5.8 GHz have power above negative fifteen decibels (−15 dB) relative to an input power.

By way of an example, when RF filter 100 fails to substantially reject undesirable frequencies in a WLAN standard, RF filter 100 may output frequencies having emission strengths that do not comply with United States regulatory requirements established by the Federal Communications Commission. In practice, semiconductor dies using the non-compliant RF filters may have to be discarded at the factory, reducing die or product yield. In some instances, most of the semiconductor dies in a given production batch may have to be discarded for using non-compliant RF filters.

Figure 2:
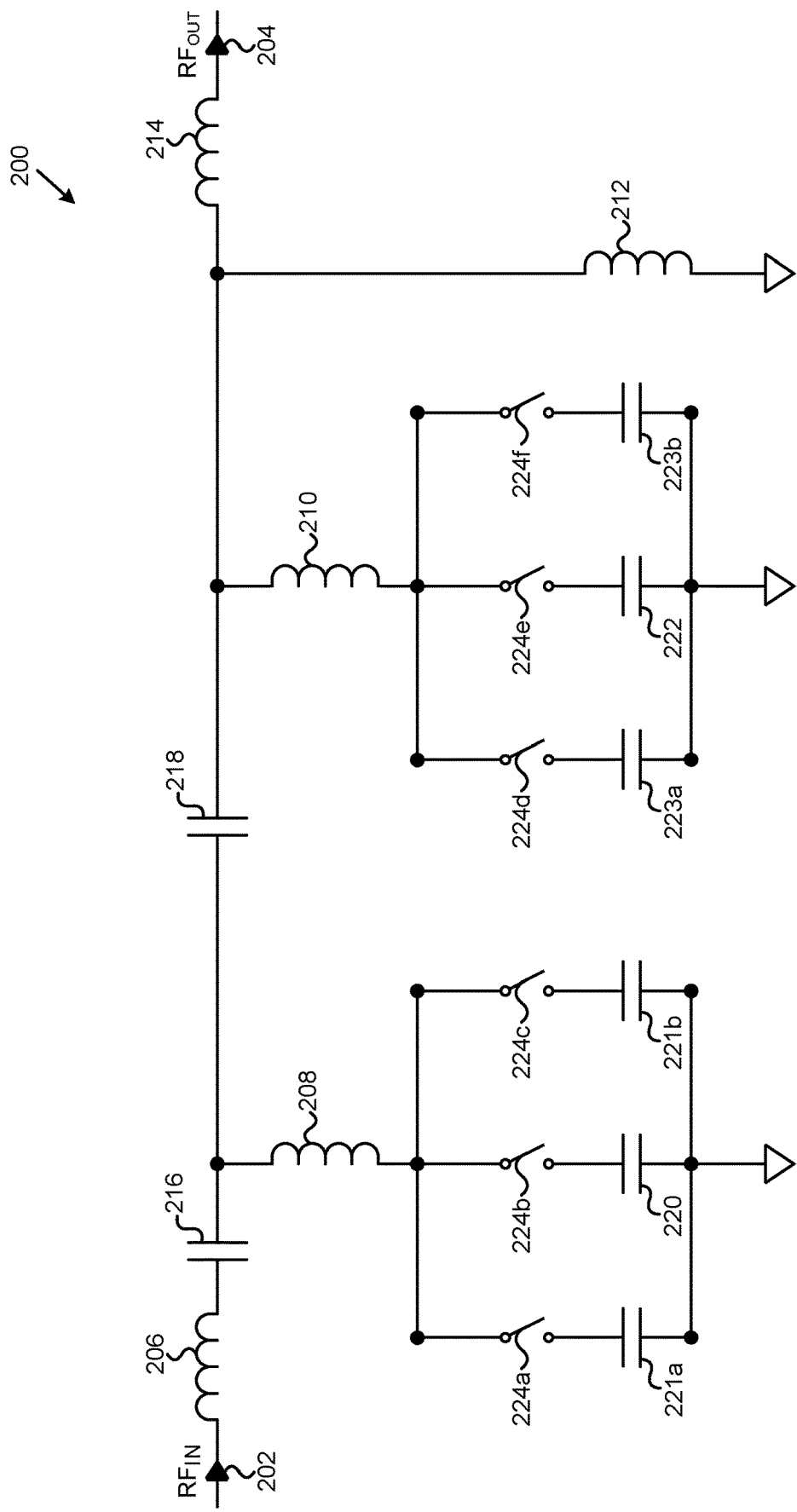
FIG. 2 illustrates a portion of a high-yield tunable RF filter according to one implementation of the present application.

FIG. 2 illustrates a portion of a high-yield tunable RF filter according to one implementation of the present application. High-yield tunable RF filter 200 includes RF input 202, RF output 204, inductors 206, 208, 210, 212, and 214, capacitors 216 and 218, primary capacitors 220 and 222, auxiliary capacitors 221a, 221b, 223a, and 223b, and non-volatile RF switches 224a, 224b, 224c, 224d, 224e, and 224f. RF input 202, RF output 204, inductors 206, 208, 210, 212, and 214, and capacitors 216 and 218 in FIG. 2 generally correspond to RF input 102, RF output 104, inductors 106, 108, 110, 112, and 114, and capacitors 116 and 118 in FIG. 1.

As shown in FIG. 2, high-yield tunable RF filter 200 includes non-volatile RF switches 224a, 224b, and 224c coupled between inductor 208 and auxiliary capacitor 221a, primary capacitor 220, and auxiliary capacitor 221b, respectively. Similarly, high-yield tunable RF filter 200 includes non-volatile RF switches 224d, 224e, and 224f coupled between inductor 210 and auxiliary capacitor 223a, primary capacitor 222, and auxiliary capacitor 223b, respectively. As described below, in one implementation, non-volatile RF switches 224a, 224b, 224c, 224d, 224e, and 224f are phase-change material (PCM) RF switches. In other implementations, non-volatile RF switches 224a, 224b, 224c, 224d, 224e, and 224f can be any non-volatile switch known in the art.

High-yield tunable RF filter 200 can be adjusted when non-volatile RF switches 224a, 224b, and 224c are in ON-states or OFF-states. For example, when non-volatile RF switch 224b is in an ON-state, primary capacitor 220 is engaged and a first capacitance can be achieved. Likewise, when non-volatile RF switch 224a or 224c is in an ON-state, auxiliary capacitor 221a or 221b is engaged and second or third capacitances can be achieved. Similarly, high-yield tunable RF filter 200 can be adjusted when non-volatile RF switches 224d, 224e, and 224f are in ON-states or OFF-states, where auxiliary capacitor 223a, primary capacitor 222, and auxiliary capacitor 223b are engaged or disengaged.

As used in the present application, "engaged" refers to having a very low resistance electrical connection to other parts of a circuit through a connecting non-volatile RF switch, e.g., when non-volatile RF switch 224a, 224b, or 224c in the path of auxiliary capacitor 221a, primary capacitor 220, or auxiliary capacitor 221b is in an ON-state (very low resistance state). Further, "disengaged" refers to, e.g., when non-volatile RF switch 224a, 224b, or 224c is in an OFF-state (very high resistance state). In various implementations, a primary or an auxiliary capacitor can be engaged by more than one non-volatile RF switch. For example, two non-volatile RF switches can be used, where one is coupled to each node of a primary or an auxiliary capacitor.

According to a given specification, high-yield tunable RF filter 200 is intended to have a certain target capacitance between inductor 208 and ground. For example, the target capacitance between inductor 208 and ground can be approximately one picofarad (1 pF). Primary capacitor 220 has a nominal capacitance that corresponds to this target capacitance. Continuing the above example, primary capacitor 220 can have a nominal capacitance of one picofarad (1 pF). Similarly, primary capacitor 222 has a nominal capacitance that corresponds to a target capacitance intended between inductor 210 and ground.

As described above, primary capacitors 220 and 222 are process-dependent and their actual capacitances can vary from their nominal capacitances. If their actual capacitances exceed upper or lower limits for a given specification, high-yield tunable RF filter 200 may fail to function properly. For example, upper and lower specification limits may be plus or minus ten percent (±10%) of target capacitances. The actual capacitances of primary capacitors 220 and 222 may be fifteen percent (15%) less than their nominal capacitances due to process dependence, outside the lower specification limit of minus ten percent. If non-volatile RF switches 224b and 224e are in ON-states and primary capacitors 220 and 222 are engaged, high-yield tunable RF filter 200 may fail to substantially admit all desired frequencies and/or may fail to substantially reject all undesired frequencies.

Auxiliary capacitors 221a and 221b represent capacitors that can substitute for primary capacitor 220, and auxiliary capacitors 223a and 223b represent capacitors that can substitute for primary capacitor 222. Auxiliary capacitors 221a and 221b each have a nominal capacitance different from the nominal capacitance of primary capacitor 220, and auxiliary capacitors 223a and 223b each have a nominal capacitance different from the nominal capacitance of primary capacitor 222. For example, auxiliary capacitor 221a can have a nominal capacitance that is ten percent (10%) less than the nominal capacitance of primary capacitor 220, and auxiliary capacitor 221b can have a nominal capacitance that is ten percent (10%) greater than the nominal capacitance of primary capacitor 220. In various implementations, other capacitors, such as capacitors 216 and 218 can also utilize auxiliary capacitors. In various implementations, primary capacitors can have more or fewer corresponding auxiliary capacitors than shown in FIG. 2.

Auxiliary capacitors 221a, 221b, 223a, and 223b are also process-dependent capacitors. Within high-yield tunable RF filter 200, auxiliary capacitors 221a, 221b, 223a, and 223b are expected to vary similarly to primary capacitors 220 and 222. Auxiliary capacitors 221a, 221b, 223a, and 223b may be substantially co-located with primary capacitors 220 and 222 in a semiconductor die and fabricated using similar techniques. Continuing the above examples, where the actual capacitances of primary capacitors 220 and 222 are fifteen percent (15%) less than their nominal capacitances due to process dependence, the actual capacitances of auxiliary capacitors 221a, 221b, 223a, and 223b may also be approximately fifteen percent (15%) less than their nominal capacitances. Where the nominal capacitance of auxiliary capacitor 221b was ten percent (10%) greater than the nominal capacitance of primary capacitor 220, after accounting for process dependence, the actual capacitance of auxiliary capacitor 221b is five percent (5%) less than the target capacitance, within the lower specification limit of minus ten percent. In this example, engaging auxiliary capacitor 221b using non-volatile RF switch 224c in an ON-state may cause high-yield tunable RF filter 200 to substantially admit all desired frequencies and/or to substantially reject all undesired frequencies.

Unlike RF filter 100 in FIG. 1, high-yield tunable RF filter 200 in FIG. 2 is tunable after fabrication. That is, primary capacitors 220 and 222 can be adjusted even after fabrication of high-yield tunable RF filter 200 by changing states of non-volatile RF switches 224a, 224b, 224c, 224d, 224e, and 224f. Where capacitors 120 and 122 in FIG. 1 are fixed and may cause RF filter 100 to fail to substantially admit desired frequencies (e.g., an admit band corresponding to a wireless communication standard) and/or fail to substantially reject undesired frequencies (e.g., a reject band corresponding to another wireless communication standard), primary capacitors 220 and 222 in FIG. 2 can be substituted for auxiliary capacitors 221a, 221b, 223a, and 223b even after fabrication of high-yield tunable RF filter 200 such that high-yield tunable RF filter 200 substantially admits desired frequencies and substantially rejects undesired frequencies. As such, high-yield tunable RF filter 200 overcomes difficulties associated with process variations to make an otherwise non-compliant RF filter compliant, thus reducing the percentage of semiconductor dies that might be discarded due to an otherwise non-compliant RF filter, and significantly improving product yield.

Importantly, because high-yield tunable RF filter 200 utilizes non-volatile RF switches 224a, 224b, 224c, 224d, 224e, and 224f, desired capacitances can be determined and then set in a factory even after fabrication of high-yield tunable RF filter 200. Using techniques described below, the states of non-volatile RF switches 224a, 224b, 224c, 224d, 224e, and 224f can be set at the factory after fabrication and after a production yield test of high-yield tunable RF filter 200. These factory-set states can then be permanently retained even without applied power and even after high-yield tunable RF filter 200 is utilized in a product or a consumer electronic device (e.g., a mobile phone) by an end-user. Non-volatile RF switches 224a, 224b, 224c, 224d, 224e, and 224f will not need to draw power after their states have been changed in a factory. Thus, a battery-powered consumer electronic device employing high-yield tunable RF filter 200 in FIG. 2 can operate longer and/or at higher voltages or currents.

Figure 3:
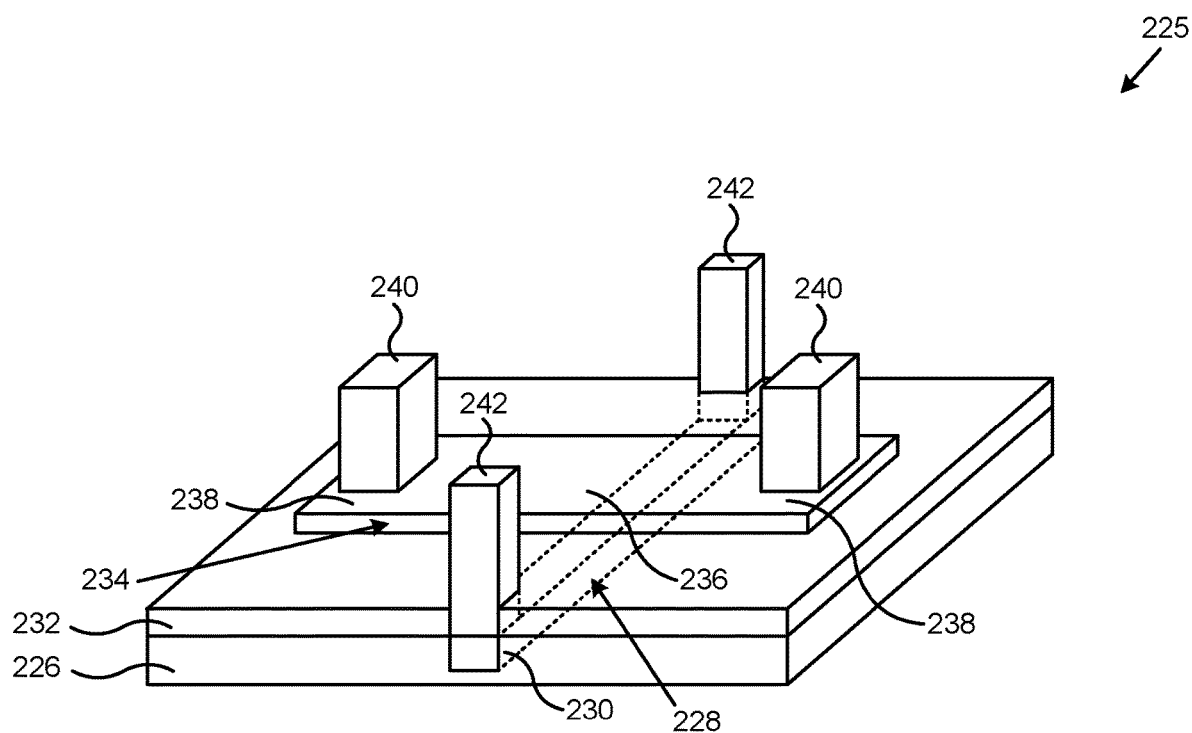
FIG. 3 illustrates a perspective view of a portion of a phase-change material (PCM) RF switch according to one implementation of the present application.

FIG. 3 illustrates a perspective view of a portion of a phase-change material (PCM) RF switch according to one implementation of the present application. PCM RF switch 225 is an example of one type of non-volatile RF switch according to the present application. For example, PCM RF switch 225 in FIG. 3 may be used as any of non-volatile RF switches 224a, 224b, 224c, 224d, 224e, and 224f in FIG. 2. As shown in FIG. 3, PCM RF switch 225 includes lower dielectric 226, heating element 228 having terminal segments 230, thermally conductive and electrically insulating material 232, PCM 234 having active segment 236 and passive segments 238, PCM contacts 240, and heater contacts 242. For purposes of illustration, the perspective view in FIG. 3 shows selected structures of PCM RF switch 225. PCM RF switch 225 may include other structures not shown in FIG. 3.

Lower dielectric 226 in PCM RF switch 225 is situated below thermally conductive and electrically insulating material 232. As shown in FIG. 3, lower dielectric 226 is also adjacent to sides of heating element 228. Lower dielectric 226 extends along the width of PCM RF switch 225, and is also coplanar with the top of heating element 228. Because PCM RF switch 225 includes lower dielectric 226 on the sides of heating element 228, less heat transfers horizontally (i.e., from the sides) and more heat dissipates vertically from heating element 228 toward active segment 236 of PCM 234. In various implementations, lower dielectric 226 can have a relative width and/or a relative thickness greater or less than shown in FIG. 3. Lower dielectric 226 can comprise any material with thermal conductivity lower than that of thermally conductive and electrically insulating material 232. In various implementations, lower dielectric 226 can comprise silicon oxide ($Si_XO_Y$), silicon nitride ($Si_XN_Y$), or another dielectric.

Heating element 228 in PCM RF switch 225 is situated in lower dielectric 226. Heating element 228 also underlies and approximately defines active segment 236 of PCM 234. Heating element 228 generates a crystallizing heat pulse or an amorphizing heat pulse for transforming active segment 236 of PCM 234. Heating element 228 can comprise any material capable of Joule heating. Heating element 228 can be connected to electrodes of a pulse generator (not shown in FIG. 3) that generates voltage or current pulses. Preferably, heating element 228 comprises a material that exhibits minimal or substantially no electromigration, thermal stress migration, and/or agglomeration. In various implementations, heating element 228 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 228 comprises tungsten lined with titanium and titanium nitride.

Thermally conductive and electrically insulating material 232 in PCM RF switch 225 is situated on top of heating element 228 and lower dielectric 226, and under PCM 234 and, in particular, under active segment 236 of PCM 234. Thermally conductive and electrically insulating material 232 ensures efficient heat transfer from heating element 228 toward active segment 236 of PCM 234, while electrically insulating heating element 228 from PCM contacts 240, PCM 234, and other neighboring structures.

Thermally conductive and electrically insulating material 232 can comprise any material with high thermal conductivity and high electrical resistivity. In various implementations, thermally conductive and electrically insulating material 232 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 232 can be a nugget that does not extend along the width of PCM RF switch 225. For example, thermally conductive and electrically insulating material 232 can be a nugget approximately aligned with heating element 228.

PCM 234 in PCM RF switch 225 is situated on top of thermally conductive and electrically insulating material 232. PCM RF switch 225 utilizes PCM 234 to transfer input RF signals in an ON-state and to block input RF signals in an OFF state. PCM 234 includes active segment 236 and passive segments 238. Active segment 236 of PCM 234 is approximately defined by heating element 228. Passive segments 238 of PCM 234 extend outward and are transverse to heating element 228, and are situated approximately under PCM contacts 240. As used in the present application, "active segment" refers to a segment of PCM that transforms between crystalline and amorphous phases, for example, in response to a crystallizing or an amorphizing heat pulse generated by heating element 228, whereas "passive segment" refers to a segment of PCM that does not make such transformation and maintains a crystalline phase (i.e., maintains a conductive state).

With proper heat pulses and heat dissipation, active segment 236 of PCM 234 can transform between crystalline and amorphous phases, allowing PCM RF switch 225 to switch between low resistivity ON-states and high resistivity OFF-states respectively. Active segment 236 of PCM 234 must be heated and rapidly quenched in order for PCM RF switch 225 to switch states. If active segment 236 of PCM 234 does not quench rapidly enough, it will not transform, and PCM RF switch 225 will fail to switch states. How rapidly active segment 236 of PCM 234 must be quenched depends on the material, volume, and temperature of PCM 234. In one implementation, the quench time window can be approximately one hundred nanoseconds (100 ns) or greater or less.

PCM 234 can comprise germanium telluride ($Ge_XTe_Y$), germanium antimony telluride ($Ge_XSb_Y Te_Z$), germanium selenide ($Ge_XSe_Y$), or any other chalcogenide. In various implementations, PCM 234 can be germanium telluride having from forty percent to sixty percent germanium by composition (i.e., $Ge_XTe_Y$, where $0.4 \leq X \leq 0.6$ and $Y=1-X$). The material for PCM 234 can be chosen based upon ON-state resistivity, OFF-state electric field breakdown voltage, crystallization temperature, melting temperature, or other considerations. It is noted that in FIG. 3, heating element 228 is transverse to PCM 234. Heating element 228 is illustrated with dashed lines as seen through various structures of PCM RF switch 225. Current flowing in heating element 228 flows approximately under active segment 236 of PCM 234.

PCM contacts 240 in PCM RF switch 225 are connected to passive segments 238 of PCM 234. Similarly, heater contacts 242 are connected to terminal segments 230 of heating element 228. PCM contacts 240 provide RF signals to and from PCM 234. Heater contacts 242 provide power to heating element 228 for generating a crystallizing heat pulse or an amorphizing heat pulse. In various implementations, PCM contacts 240 and heater contacts 242 can comprise tungsten (W), copper (Cu), or aluminum (Al). PCM contacts 240 and heater contacts 242 can extend through various dielectric layers (not shown in FIG. 3). In one implementation, in order to ensure uniform contact between PCM 234 and PCM contacts 240, PCM contacts 240 can extend through a contact uniformity support layer (not shown in FIG. 3) situated on top of PCM 234, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

Due to its structure, PCM RF switch 225 has very low insertion loss at radio frequencies. In particular, PCM 234 in the crystalline state has low resistivity, while PCM 234 in the amorphous state has high resistivity. In various implementations, the OFF-state resistance ($R_{OFF}$) of PCM RF switch 225 can range from approximately ten kilo-Ohms to approximately one mega-Ohm (10 kΩ-1MΩ), while the ON-state resistance ($R_{ON}$) of PCM RF switch 225 can be approximately one Ohm (1Ω) or less. The low insertion loss of PCM RF switch 225 is particular advantageous for RF filtering. An RF filter, such as high-yield tunable RF filter 200 in FIG. 2, can employ more PCM RF switches 225 in order to tune its frequency response in more combinations, without insertion losses prohibiting proper RF filtering.

In addition to having low insertion loss, PCM RF switch 225 is advantageously non-volatile. That is, PCM 234 maintains its crystalline (ON-state) or amorphous phase (OFF-state) even when power is not supplied to heating element 228. PCM RF switch 225 requires less power than conventional switches when remaining in an ON-state. Also, PCM RF switch 225 is resilient to voltage fluctuations in its programming, making PCM RF switch 225 particularly applicable in antenna tuners and other circuits which might experience large voltage fluctuations.

Figure 4:
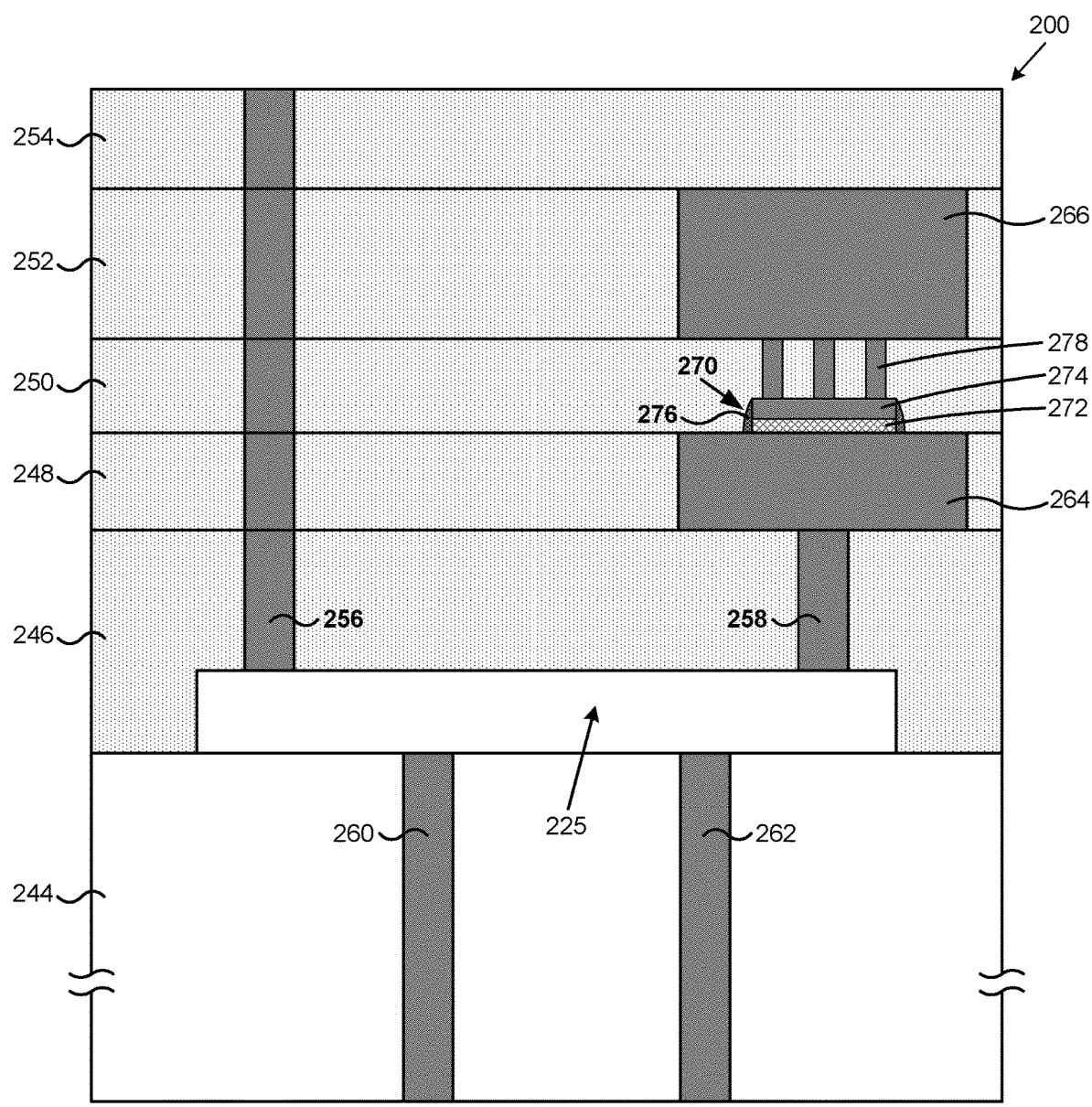
FIG. 4 illustrates a cross sectional view of a portion of a high-yield tunable RF filter according to one implementation of the present application.

FIG. 4 illustrates a cross sectional view of a portion of a high-yield tunable RF filter according to one implementation of the present application. In particular, FIG. 4 illustrates a process-dependent capacitor connected to a non-volatile RF switch. High-yield tunable RF filter 200 includes PCM RF switch 225, substrate 244, interlayer dielectrics 246, 250, and 254, interlayer metal levels 248 and 252, vias 256, 258, 260, and 262, metal-insulator-metal (MIM) capacitor 270 having interconnect metal 264, high-k film 272, top MIM metal 274, and spacers 276, vias 278, and interconnect metal 266. PCM RF switch 225 in FIG. 4 generally corresponds to PCM RF switch 225 in FIG. 3, and may have any implementations and advantages described above. However, PCM RF switch 225 is shown with less detail in FIG. 4 to preserve conciseness.

Substrate 244 is situated under PCM RF switch 225. In one implementation, substrate 244 is an insulator, such as silicon oxide (SiO$_2$). In various implementations, substrate 244 is a silicon (Si), silicon-on-insulator (SOI), sapphire, complementary metal-oxide-semiconductor (CMOS), bipolar CMOS (BiCMOS), or group III-V substrate. In various implementations, substrate 244 includes a heat spreader or substrate 244 itself performs as a heat spreader, to dissipate excess heat generated by heating element 228 (shown in FIG. 3) of PCM RF switch 225 after a heat pulse, such as a crystallizing heat pulse or an amorphizing heat pulse, has transformed the state of PCM RF switch 225 to an ON-state or an OFF-state. Substrate 244 can have additional layers (not shown in FIG. 4). In one implementation, substrate 244 can comprise a plurality of interconnect metal levels and interlayer dielectric layers. Substrate 244 can also comprise a plurality of devices, such as integrated passive devices (not shown in FIG. 4).

Interlayer dielectric 246, interlayer metal level 248, interlayer dielectric 250, interlayer metal level 252, and interlayer dielectric 254 are sequentially situated over substrate 244. Interlayer dielectric 246 typically comprises a pre-metal dielectric that is not shown in FIG. 4. The pre-metal dielectric would surround the top and the sides of PCM RF switch 225, and metal level one would be built over the pre-metal dielectric. However, for ease of illustration, FIG. 4 broadly shows interlayer dielectric 246 which includes a pre-metal dielectric (not shown) over which metal level one is fabricated. Interlayer metal level 248 provides a layer in which passive devices and interconnect metals, such as interconnect metal 264, can be built. Interlayer metal level 252 is, for example, a second interlayer metal level and interconnect metal 266 is formed in this level. Interlayer dielectric 250 provides insulation between interlayer metal levels 248 and 252. Interlayer dielectric 254 provides insulation for interlayer metal level 252. Interlayer dielectrics 246, 250, and 254 also provide layers in which via segments can be built. In various implementations, high-yield tunable RF filter 200 can include more interlayer metal levels and/or more interlayer dielectrics than those shown in FIG. 4.

Vias 256, 258, 260, and 262 provide for electrical connections to PCM RF switch 225 and/or MIM capacitor 270. Specifically, via 256 electrically connects one of PCM contacts 240 (shown in FIG. 3) of PCM RF switch 225 to another structure in high-yield tunable RF filter 200, such as inductor 208 (shown in FIG. 2), or to an external connector, such as a micro bump or a contact pad. Via 258 electrically connects one of PCM contacts 240 (shown in FIG. 3) of PCM RF switch 225 to interconnect metal 264 of MIM capacitor 270. Via 260 and 262 electrically connect heater contacts 242 (shown in FIG. 3) of PCM RF switch 225, for example, to a pulse generator and to ground.

It is noted that in the present application, multiple vias and metal segments connected as a unit are referred to as a "via" for ease of reference. For example, in FIG. 4, via 256 includes a first via in interlayer dielectric 246, a first metal segment in interlayer metal level 248, a second via in interlayer dielectric 250, a second metal segment in interlayer metal level 252, and a third via in interlayer dielectric 254. Metal segments are typically wider than vias and include overplots; however, for ease of illustration and for focus on the present inventive concepts, the metal segments and vias are shown as one continuous "via" 256 in FIG. 4, and a similar representation may apply to other drawings in the present application.

Also, it is noted that the actual relative position of vias 256, 258, 260, and 262 may be different from the exemplary cross-sectional view shown in FIG. 4. For example, via 260 in FIG. 4 (connected to one of heater contacts 242 in FIG. 3) may be situated on a different plane relative to vias 256 and 258 (connected to PCM contacts 240 in FIG. 3), and via 262 in FIG. 4 (connected to one heater contacts 242 in FIG. 3) may be situated on yet a different plane relative to vias 256 and 258. In other words, vias 256 and 258 may be situated in different planes and crosswise to vias 260 and 262.

Although vias 260 and 262 are illustrated as through-substrate-vias (TSVs) in FIG. 4, in various implementations, vias 260 and 262 can extend through interlayer metal levels and/or interlayer dielectrics. In various implementations, PCM RF switch 225 can be situated on an interlayer metal level and/or an interlayer dielectric, rather than on substrate 244. Although not shown in FIG. 4, it is understood that high-yield tunable RF filter 200 can include more or fewer interlayer metal levels and/or interlayer dielectrics, additional devices (not shown) in interlayer metal levels and/or interlayer dielectrics, and passivation covering the bottom and/or top of high-yield tunable RF filter 200.

In high-yield tunable RF filter 200, high-k film 272 is situated on interconnect metal 264. Interconnect metal 264 in interlayer metal level 248 is a bottom capacitor plate of MIM capacitor 270. In various implementations, thin high-k film 272 comprises tantalum pentoxide, aluminum oxide, hafnium oxide, zirconium oxide, zirconium aluminum silicate, hafnium silicate, hafnium aluminum silicate, or other dielectrics with a relatively high dielectric constant. In one implementation, the thickness of thin high-k film 272 can range from approximately two hundred angstroms to approximately six hundred angstroms (200 Å-600 Å).

Top MIM metal 274 is situated over high-k film 272. Top MIM metal 274 is a top capacitor plate of MIM capacitor 270. Top MIM metal 274 can comprise, for example, titanium nitride, tantalum nitride, or a stack comprising aluminum and titanium nitride or tantalum nitride. In one implementation, the thickness of top MIM metal 274 can range from approximately one thousand angstroms to approximately three thousand angstroms (1,000 Å-3,000 Å). Top MIM metal 274 can be provided, for example, by physical vapor deposition (PVD) or chemical vapor deposition (CVD) techniques. As used herein, "MIM capacitor" refers to a capacitor having a top metal formed within an interlayer dielectric where conventionally no metal exists, such as within interlayer dielectric 250.

Spacers 276 are situated adjacent to the sidewalls of high-k film 272 and top MIM metal 274 of MIM capacitor 270. In various implementations, spacers 276 can comprise $Si_xN_y$, or another dielectric. Spacers 276 protect the sidewalls of high-k film 272 from aggressive etch chemistry used to etch metals during fabrication of high-yield tunable RF filter 200. Thus, there is no increase in leakage current of MIM capacitor 270 or decrease in the breakdown voltage of MIM capacitor 270 due to an increase in defects or voids within high-k film 272. As such, the capacitance of MIM capacitor 270 is more precisely controlled, and high-yield tunable RF filter 200 is more reliable.

Vias 278 connect top MIM metal 274 of MIM capacitor 270 to interconnect metal 266. Thus, top MIM metal 274, vias 278, and interconnect metal 266 together form one node. In various implementations, MIM capacitor 270 can be connected by more or fewer vias than shown in FIG. 4. Notably, because top MIM metal 274 is within interlayer dielectric 250, vias 278 only extend partially through interlayer dielectric 250. Interconnect metal 266 may connect to another structure in high-yield tunable RF filter 200, such as a ground.

MIM capacitor 270 formed by interconnect metal 264, high-k film 272, and top MIM metal 274 have a capacitance with significantly improved density. MIM capacitor 270 does not require addition of interlayer metal levels, and also does not use up lateral die space. MIM capacitor 270 advantageously increases routing capability because MIM capacitor 270 utilizes the space amply available between interlayer metal levels 248 and 252.

Figure 5:
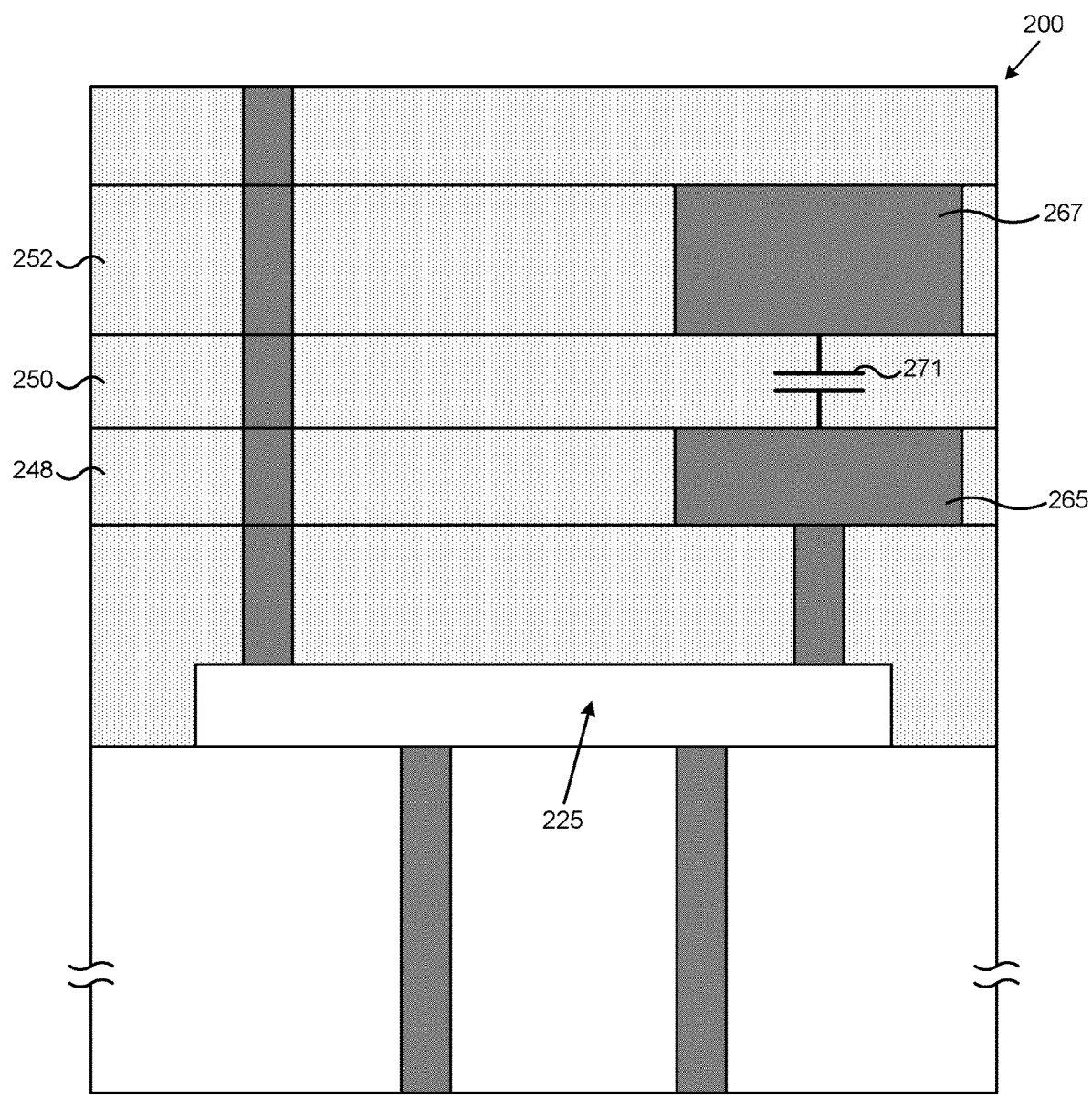
FIG. 5 illustrates a cross sectional view of a portion of a high-yield tunable RF filter according to one implementation of the present application.

FIG. 5 illustrates a cross sectional view of a portion of a high-yield tunable RF filter according to one implementation of the present application. In particular, FIG. 5 illustrates a process-dependent capacitor connected to a non-volatile RF switch, as an alternative to the implementation in FIG. 4. High-yield tunable RF filter 200 in FIG. 5 is similar to high-yield tunable RF filter 200 in FIG. 4, except that in FIG. 5, PCM RF switch 225 is connected to vertical metal-oxide-metal (MOM) capacitor 271, rather than MIM capacitor 270.

Vertical MOM capacitor 271 is formed between interconnect metal 265 in interlayer metal level 248 and interconnect metal 267 in interlayer metal level 252. Interconnect metal 265 and interconnect metal 267 function as the bottom and top capacitor plates, respectively, of vertical MOM capacitor 271. It is noted that, unlike MIM capacitor 270 in FIG. 4, the top capacitor plate of vertical MOM capacitor 271 in FIG. 5 is not formed in an interlayer dielectric, such as interlayer dielectric 250. Also, the bottom and top capacitor plates of vertical MOM capacitor 271 in FIG. 5 are separated by interlayer dielectric 250, rather than high-k film 272 in FIG. 4. MIM and MOM capacitors are examples of two types of process-dependent parallel plate capacitors according to the present application. In various implementations, high-yield tunable RF filter 200 can utilize any other types of process-dependent capacitors, such as horizontal MOM capacitors or interdigitated capacitors.

Figure 6A:
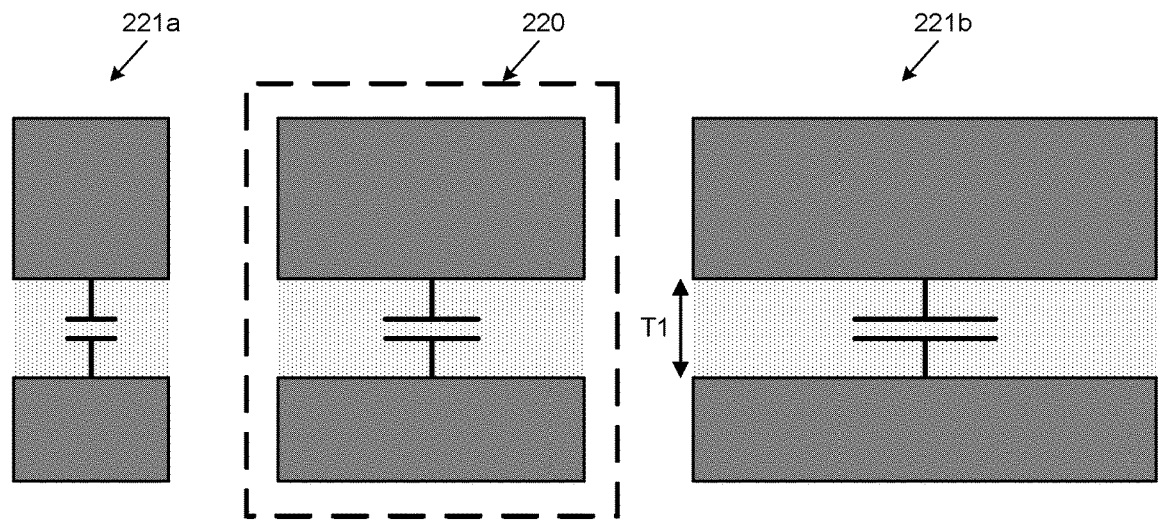
FIG. 6A illustrates cross sectional views of portions of process-dependent capacitors according to one implementation of the present application.

FIG. 6A illustrates cross sectional views of portions of process-dependent capacitors according to one implementation of the present application. The process dependent capacitors include primary capacitor 220 and auxiliary capacitors 221a and 221b, which generally correspond to primary capacitor 220 and auxiliary capacitors 221a and 221b in FIG. 2.

As described above, primary capacitor 220, auxiliary capacitor 221a, or auxiliary capacitor 221b in FIG. 5 can be engaged to achieve a target capacitance. The nominal capacitance of primary capacitor 220 is chosen to be approximately equal to the target capacitance, whereas the nominal capacitances of auxiliary capacitors 221a and 221b are chosen to be less than and greater than the target capacitance, respectively. For example, the nominal capacitance of primary capacitor 220 is chosen to be approximately equal to a target capacitance of one picofarad (1 pF), whereas the nominal capacitances of auxiliary capacitors 221a and 221b are chosen to be nine tenths of a picofarad (0.9 pF) and one and one tenth of a picofarad (1.1 pF) respectively. The dimensions and materials utilized in primary capacitor 220 and auxiliary capacitors 221a and 221b are designed to achieve their nominal capacitances assuming no process variation. Primary capacitor 220 and auxiliary capacitors 221a and 221b may be substantially co-located in a semiconductor die and fabricated using similar techniques. In various implementations, each of primary capacitor 220 and auxiliary capacitors 221a and 221b may be a different type of capacitor and/or may be fabricated using a different technique.

In FIG. 6A, the fabrication process is highly accurate, exhibiting little to no variation from the specification, and the actual capacitances of primary capacitor 220 and auxiliary capacitors 221a and 221b are approximately their nominal capacitances (1.0 pF, 0.9 pF, and 1.1 pF respectively). Accordingly, in order to achieve the target capacitance (1.0 pF), primary capacitor 220 should be engaged, as shown by the dashed outline around primary capacitor 220 in FIG. 6A.

Figure 6B:
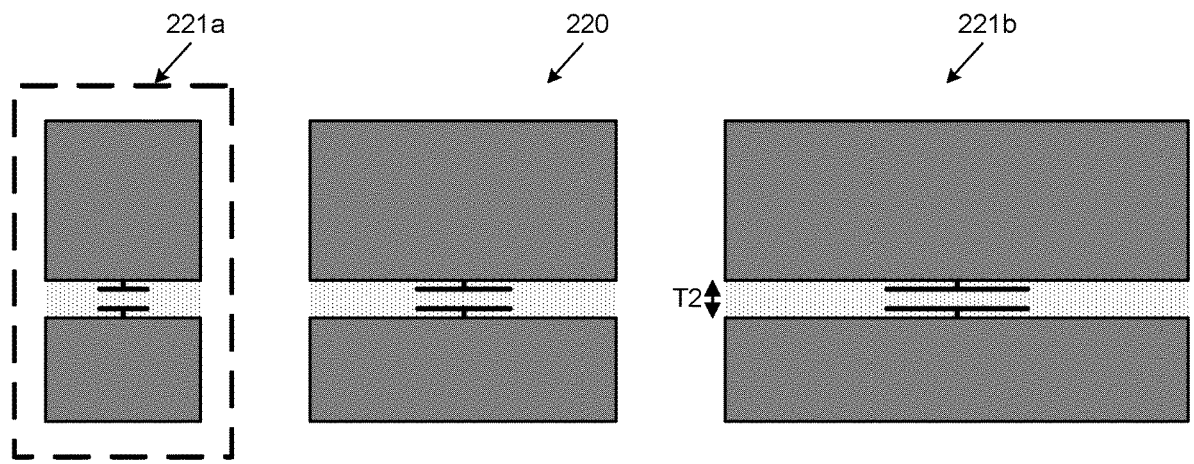
FIG. 6B illustrates cross sectional views of portions of process-dependent capacitors according to one implementation of the present application.

FIG. 6B illustrates cross sectional views of portions of process-dependent capacitors according to one implementation of the present application. In FIG. 6B, due to process dependence, primary capacitor 220 and auxiliary capacitors 221a and 221b exhibit variations from the specification. In particular, the thickness of dielectric in primary capacitor 220 and auxiliary capacitors 221a and 221b in FIG. 6B has thickness T2, which is thinner than thickness T1 in FIG. 6A. As a result, the actual capacitances of primary capacitor 220 and auxiliary capacitors 221a and 221b are higher than their nominal capacitances (e.g., 1.1 pF, 1.0 pF, and 1.2 pF respectively, rather than 1.0 pF, 0.9 pF, and 1.1 pF respectively). Accordingly, in order to achieve the target capacitance (1.0 pF), auxiliary capacitor 221a should be engaged instead of primary capacitor 220, as shown by the dashed outline around auxiliary capacitor 221a in FIG. 6B.

The relative thickness difference illustrated in FIGS. 6A and 6B may be exaggerated for clarity; a particular fabrication process may exhibit less or more variation. In various implementations, the dielectric may be thicker than specification, rather than thinner Additionally, primary capacitor 220 and auxiliary capacitors 221a and 221b may exhibit other process dependencies, such as variations in the dimensions of bottom and/or top plates due to etch chemistry, nonconformities due to deposition technique, etc. In various implementations, primary capacitor 220 and auxiliary capacitors 221a and 221b may vary non-uniformly. For example, the actual capacitance of primary capacitor 220 may be twenty percent (20%) less than its nominal capacitance, while the actual capacitance of auxiliary capacitor 221a may be only five percent (5%) less than its nominal capacitance. As described below, utilizing more auxiliary capacitors can generally overcome more significant process dependence.

Figure 7:
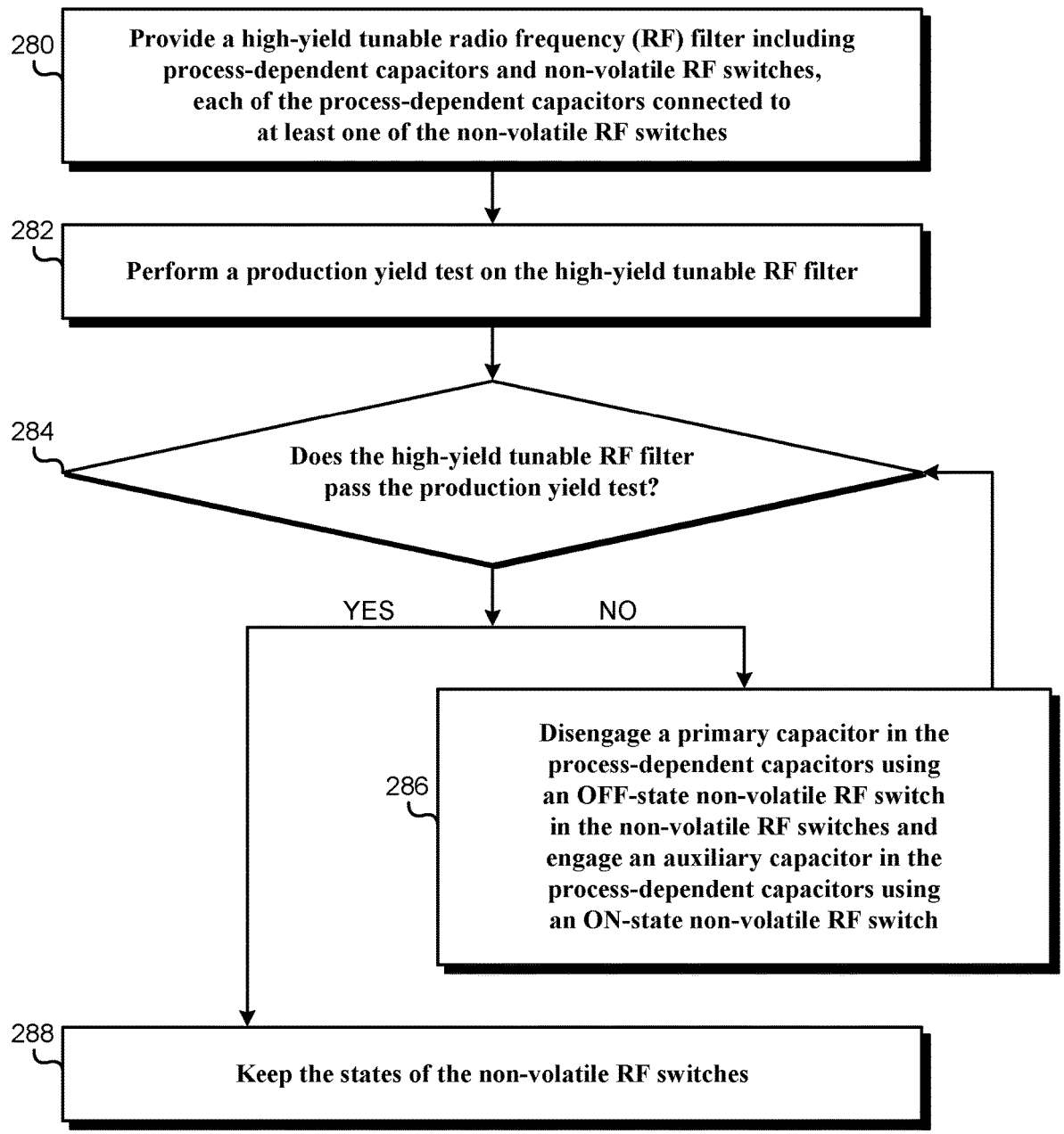
FIG. 7 illustrates a portion of a flowchart of an exemplary method for using a high-yield tunable RF filter according to one implementation of the present application.
Figure 8:
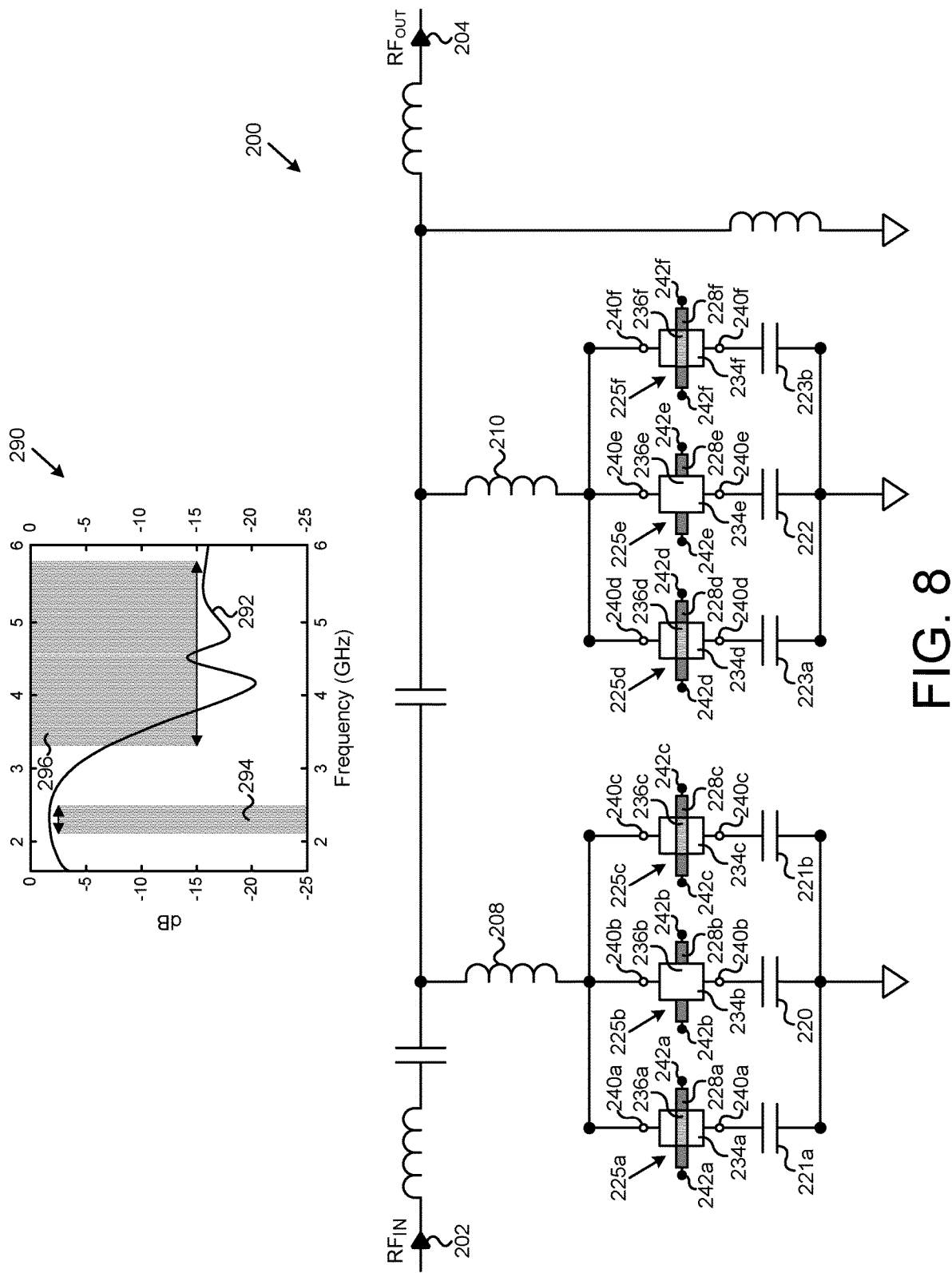
FIG. 8 illustrates a portion of a high-yield tunable RF filter and a corresponding frequency response graph used in accordance with the flowchart in FIG. 7 according to one implementation of the present application.
Figure 9:
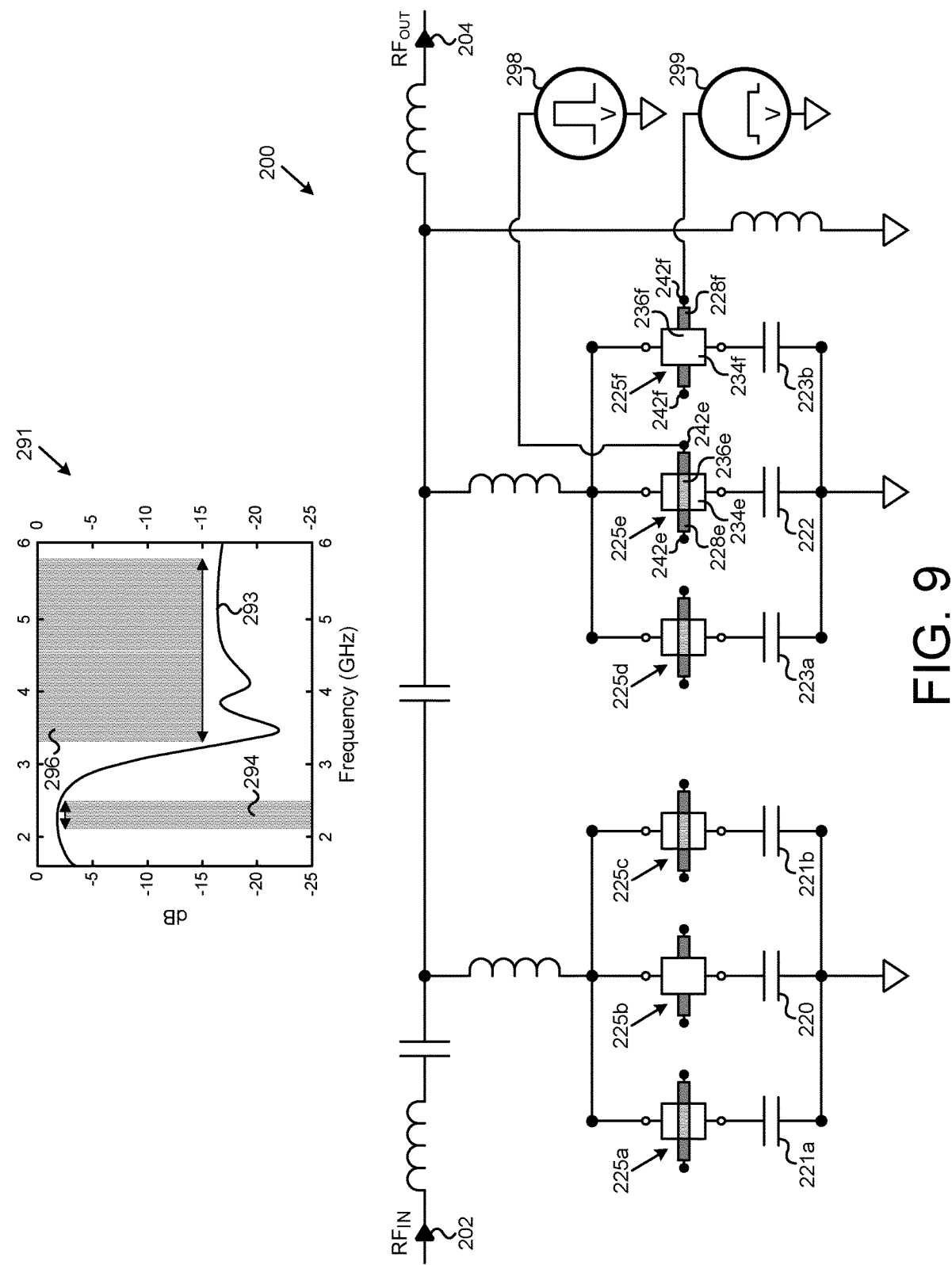
FIG. 9 illustrates a portion of a high-yield tunable RF filter and a corresponding frequency response graph used in accordance with the flowchart in FIG. 7 according to one implementation of the present application.

FIG. 7 illustrates a portion of a flowchart of an exemplary method for using a high-yield tunable RF filter according to one implementation of the present application. Structures shown in FIGS. 8 and 9 illustrate the results of performing the method according to the flowchart in FIG. 7. Actions 280, 282, 284, 286, and 288 shown in the flowchart in FIG. 7 are sufficient to describe one implementation of the present inventive concepts. Other implementations of the present inventive concepts may utilize actions different from those shown in the flowchart of FIG. 7. Certain details and features have been left out of the flowchart that are apparent to a person of ordinary skill in the art. For example, an action may consist of one or more sub-actions or may involve specialized equipment or materials, as known in the art. Moreover, some actions are omitted so as not to distract from the illustrated actions.

FIG. 8 illustrates a portion of a high-yield tunable RF filter and a corresponding frequency response graph used in accordance with the flowchart in FIG. 7 according to one implementation of the present application. High-yield tunable RF filter 200 in FIG. 8 is similar to high-yield tunable RF filter 200 in FIG. 2, except that, non-volatile RF switches 224a, 224b, 224c, 224d, 224e, and 224f in FIG. 2 are shown as PCM RF switches 225a, 225b, 225c, 225d, 225e, and 225f in FIG. 8. PCM RF switches 225a, 225b, 225c, 225d, 225e, and 225f include respective heating elements 228a, 228b, 228c, 228d, 228e, and 228f, respective PCMs 234a, 234b, 234c, 234d, 234e, and 234f, respective active segments 236a, 236b, 236c, 236d, 236e, and 236f, respective PCM contacts 240a, 240b, 240c, 240d, 240e, and 240f, and respective heater contacts 242a, 242b, 242c, 242d, 242e, and 242f. PCM RF switches 225a, 225b, 225c, 225d, 225e, and 225f in FIG. 8 generally correspond to PCM RF switch 225 in FIG. 3, and may have any implementations or advantages described above.

In accordance with action 280 in FIG. 7, high-yield tunable RF filter 200 in FIG. 8 is provided with process-dependent capacitors connected to at least one non-volatile RF switch. PCM contacts 240a, 240b, and 240c are coupled to inductor 208 and to respective auxiliary capacitor 221a, primary capacitor 220, and auxiliary capacitor 221b. In a similar fashion, PCM contacts 240d, 240e, and 240f are coupled to inductor 210 and to respective auxiliary capacitor 223a, primary capacitor 222, and auxiliary capacitor 223b.

In FIG. 8, high-yield tunable RF filter 200 is provided with PCM RF switches 225b and 225e in ON-states. Active segments 236b and 236e of PCMs 234b and 234e are in a crystalline phase, have low resistivity, and are able to easily conduct electrical current. RF signals from inductors 208 and 210 propagate across PCM RF switches 225b and 225e through respective first PCM contacts 240b and 240e, through respective PCMs 234b and 234e, through respective second PCM contacts 240b and 240e, to respective primary capacitors 220 and 222. Accordingly, primary capacitors 220 and 222 are engaged. Conversely, PCM RF switches 225a, 225c, 225d, and 225f are in OFF-states. Active segments 236a, 236c, 236d, and 236f of PCMs 234a, 234c, 234d, and 234f are in an amorphous phase, have high resistivity, and do not easily conduct electrical current. Accordingly, auxiliary capacitors 221a, 221b, 223a, and 223b are disengaged.

In one implementation, since PCMs 234a, 234b, 234c, 234d, 234e, and 234f are deposited in crystalline states, and PCM RF switches 225a, 225b, 225c, 225d, 225e, and 225f are in ON-states by default, heater contacts 242a, 242c, 242d, and 242f can provide amorphizing electrical pulses to respective heating elements 228a, 228c, 228d, and 228f for generating amorphizing heat pulses for transforming respective active segments 236a, 236c, 236d, and 236f of PCMs 234a, 234c, 234d, and 234f from crystalline to amorphous phases, thereby switching respective PCM RF switches 225a, 225c, 225d, and 225f from ON-states to OFF-states. Thereafter, heater contacts 242a, 242c, 242d, and 242f can be decoupled from a power source and float, as shown in FIG. 8. In an alternative implementation, PCMs 234a, 234c, 234d and 234f are deposited in amorphous states, such that PCM RF switches 225a, 225c, 225d, and 225f are in OFF-states by default, and auxiliary capacitors 221a, 221b, 223a, and 223b are disengaged by default.

In accordance with action 282 in FIG. 7, a production yield test is performed on high-yield tunable RF filter 200 in FIG. 8. A frequency response test is an example of one type of production yield test according to the present application. A test RF signal can be applied to high-yield tunable RF filter 200, for example, by connecting a signal generator at RF input 202. In various implementations, the test RF signal can be a frequency sweep or a multi-frequency impulse. The frequencies being output by high-yield tunable RF filter 200 can be detected, for example, by connecting a meter to RF output 204. Actions 282 can be performed at the factory by an automated test equipment (ATE).

Frequency response graph 290 in FIG. 8 illustrates the results of performing action 282 in the flowchart in FIG. 7 on the high-yield tunable RF filter 200 in FIG. 8. Trace 292 in frequency response graph 290 illustrates the power at RF output 204, measured in decibels, versus the frequency, in gigahertz, applied at RF input 202. As shown in frequency response graph 290, trace 292 has a maximum near approximately two and three tenths gigahertz (2.3 GHz) and a minimum near approximately four and a quarter gigahertz (4.25 GHz).

The flowchart in FIG. 7 continues at action 284 with determining whether high-yield tunable RF filter 200 passes the production yield test. Continuing the above example, action 284 can comprise determining whether high-yield tunable RF filter 200 substantially rejects an undesired frequency and substantially admits a desired frequency. Frequency response graph 290 can be used to determine whether high-yield tunable RF filter 200 in FIG. 8 substantially rejects an undesired frequency and substantially admits a desired frequency. Continuing the above example, high-yield tunable RF filter 200 may have been designed to substantially admit frequencies between approximately 2.1 GHz and 2.5 GHz, and to substantially reject frequencies between approximately 3.3 GHz and 5.8 GHz. In the present example, the desired frequencies may correspond to fundamental frequencies in a wireless communication standard. The undesired frequencies may correspond to fundamental frequencies in another wireless communication standard.

High-yield tunable RF filter 200 may fail to substantially admit the desired frequencies when a power level is below negative two and a half decibels (−2.5 dB) relative to an input power. Region 294 in frequency response graph 290 indicates the corresponding region where high-yield tunable RF filter 200 may fail to substantially admit the desired frequencies. Since trace 292 is clear of region 294, it can be determined that high-yield tunable RF filter 200 successfully substantially admits the desired frequencies.

High-yield tunable RF filter 200 may fail to substantially reject undesired frequencies when a power level is above negative fifteen decibels (−15 dB) relative to an input power. Region 296 in frequency response graph 290 indicates the corresponding region where high-yield tunable RF filter 200 may fail to substantially reject the undesired frequencies. Since trace 292 intersects region 296, it can be determined that high-yield tunable RF filter 200 does not substantially reject the undesired frequencies. In various implementations, any other frequencies may be desired or undesired, and any other power levels may be used to determine whether high-yield tunable RF filter 200 substantially admits or substantially rejects frequencies.

FIG. 9 illustrates a portion of a high-yield tunable RF filter and a corresponding frequency response graph used in accordance with the flowchart in FIG. 7 according to one implementation of the present application. In the present example, because high-yield tunable RF filter 200 did not substantially reject the undesired frequencies in FIG. 8, the flowchart in FIG. 7 continues at action 286 with disengaging a primary capacitor using an OFF-state non-volatile RF switches and engaging an auxiliary capacitor using an ON-state non-volatile RF switch.

In FIG. 9, pulse generator 298 is coupled to a first one of heater contacts 242e in PCM RF switch 225e. A second one of heater contacts 242e can be coupled to ground (not shown in FIG. 9). Pulse generator 298 generates electrical pulses and provides power to heating element 228e. An electrical pulse that holds heating element 228e at or above an amorphization voltage ($V_A$) for a brief amount of time will cause the heating element to generate an amorphizing heat pulse that will transform active segment 236e of PCM 234e into an amorphous phase. Accordingly, such an electrical pulse may be referred to as an amorphizing electrical pulse in the present application. Amorphization voltage $V_A$ and how briefly that voltage can be held to transform an active segment of PCM into an amorphous phase depends on various factors, such as the material, dimensions, temperature, and thermal conductivity of the heating element, the PCM, and their neighboring structures. In one implementation, amorphization voltage $V_A$ can be approximately fifteen volts (15 V). In one implementation, the time required can range from approximately fifty nanoseconds or less to approximately five hundred nanoseconds or less (50 ns-500 ns).

Similarly, pulse generator 299 is coupled to a first one of heater contacts 242f in PCM RF switch 225f. A second one of heater contacts 242f can be coupled to ground (not shown in FIG. 9). Pulse generator 299 generates electrical pulses and provides power to heating element 228f. An electrical pulse that holds heating element 228f at or above a crystallizing voltage ($V_C$) for a sufficient amount of time will cause the heating element to generate a crystallizing heat pulse that will transform active segment 236f of PCM 234f into a crystalline phase. Accordingly, such an electrical pulse may be referred to as a crystallizing electrical pulse in the present application. Crystallizing voltage $V_C$ and the amount of time needed to transform an active segment of PCM into a crystalline phase depends on various factors, such as the material, dimensions, temperature, and thermal conductivity of the heating element, the PCM, and their neighboring structures. In one implementation, crystallizing voltage $V_C$ can be approximately six volts (6 V). In one implementation, the time required can range from approximately one hundred nanoseconds to two thousand nanoseconds (100 ns-2,000 ns) or greater or less.

In one implementation, pulse generators 298 and 299 may utilize factory probes for selectively applying electrical pulses to heater contacts of the PCM RF switches during wafer level testing or die level testing prior to packaging. Alternatively, pulse generators 298 and 299 may utilize test pins or functional pins to selectively apply electrical pulses to heater contacts of the PCM RF switches during testing of packaged dies. In response to an amorphizing electrical pulse from pulse generator 298, heating element 228e generates an amorphizing heat pulse and transforms active segment 236e of PCM 234e to an amorphous phase that does not easily conduct electrical current. Accordingly, PCM RF switch 225e in FIG. 9 is switched to an OFF-state, and primary capacitor 222 is disengaged. Similarly, in response to a crystallizing electrical pulse from pulse generator 299, heating element 228f generates a crystallizing heat pulse and transforms active segment 236f of PCM 234f to a crystalline phase that easily conducts electrical current. Accordingly, PCM RF switch 225f in FIG. 9 is switched to an ON-state, and auxiliary capacitor 223b is engaged.

Although pulse generators 298 and 299 are illustrated as voltage generators in FIG. 9, in one implementation, pulse generators 298 and 299 can be current generators. Although pulse generators 298 and 299 are illustrated as being connected to respective PCM RF switches 225e and 225f for concurrently disengaging primary capacitor 222 and engaging auxiliary capacitor 223b, in one implementation, PCM RF switches 225e and 225f may share a pulse generator. A shared pulse generator can be coupled to PCM RF switches 225e and 225f one at a time (e.g., coupled to PCM RF switch 225e first, decoupled therefrom, and then coupled to PCM RF switch 225f). Although FIG. 9 illustrates concurrently disengaging primary capacitor 222 and engaging auxiliary capacitor 223b, more capacitors can be engaged or disengaged at a time.

In frequency response graph 291, trace 293 illustrates the power at RF output 204, measured in decibels, versus the frequency, in gigahertz, applied at RF input 202. As shown by trace 293, high-yield tunable RF filter 200 in FIG. 9 exhibits a different frequency response compared to high-yield tunable RF filter 200 in FIG. 8, because in FIG. 9 PCM RF switch 225e is in an OFF-state and PCM RF switch 225f is in an ON-state. In frequency response graph 291, trace 293 has a maximum near approximately two and three tenths gigahertz (2.3 GHz) and a minimum near approximately three and half gigahertz (3.5 GHz). Compared to the profile of trace 292 in FIG. 8, the profile of trace 293 in FIG. 9 around its minimum is shifted to the left.

Because primary capacitor 222 is disengaged and auxiliary capacitor 223b is engaged in FIG. 9, the flowchart in FIG. 7 continues at action 284 with determining whether high-yield tunable RF filter 200 passes the production yield test. Continuing the above example, action 284 can comprise determining whether high-yield tunable RF filter 200 substantially rejects an undesired frequency and substantially admits a desired frequency. Since trace 293 no longer intersects and is clear of region 296, it can be determined that high-yield tunable RF filter 200 also now successfully substantially rejects the undesired frequencies. In other words, disengaging primary capacitor 222 and engaging auxiliary capacitor 223b causes high-yield tunable RF filter 200 to pass the production yield test. In accordance with action 288 in the flowchart of FIG. 7, PCM RF switches 225a, 225b, 225c, 225d, 225e, and 225f can be kept in their respective OFF-state or ON-state, by not providing any further amorphizing or crystallizing electrical pulses. Thus, high-yield tunable RF filter 200 permanently retains the ability to pass the production yield test, despite its initial failure caused by process dependence of primary capacitor 222.

In various implementations, primary capacitors 220 and 222 and auxiliary capacitors 221a, 221b, 223a, and 223b may need to be engaged or disengaged multiple times before high-yield tunable RF filter 200 successfully passes a production yield test. In other words, several iterations of actions 284 and 286 in the flowchart in FIG. 7 may be performed. In the present implementation, there are nine combinations where one of primary capacitor 220, auxiliary capacitor 221a, or auxiliary capacitor 221b is engaged and one of primary capacitor 222, auxiliary capacitor 223a, or auxiliary capacitor 223b is engaged. In one implementation, a production yield test is performed on all nine combinations to determine an optimal combination (e.g., a combination have the largest bandwidths clearing admit/reject bands), and then primary capacitors 220 and 222 and auxiliary capacitors 221a, 221b, 223a, and 223b corresponding to that optimal combination are engaged/disengaged. Notably, some RF filters in a given production batch may pass a production yield test when primary capacitors 220 and 222 are engaged, while other RF filters in the same production batch may pass the production yield test due when primary capacitors 220 and 222 are substituted with auxiliary capacitors 221a, 221b, 223a, and 223b. Thus, the present invention is particularly useful to correct RF filters fabricated using less reliable processes where capacitors exhibit a significant degree of process variation.

In various implementations, high-yield tunable RF filter 200 can utilize auxiliary capacitors to pass production yield tests other than frequency response tests, such as tests regarding response time, quality factor, etc. The nominal capacitances of auxiliary capacitors 221a, 221b, 223a, and 223b can be chosen based on the type of production yield test, as well as a target capacitance and specification limits. In one implementation, the nominal capacitances of auxiliary capacitors 221a, 221b, 223a, and 223b are chosen such that their differences from the nominal capacitances of their corresponding primary capacitors 220 and 222 are integer multiples of the difference between the target capacitance value and a specification limit. For example, where a target capacitance is one picofarad (1 pF) and upper and lower specification limits are plus or minus one percent (±1%) of the target capacitance, and auxiliary capacitors may have nominal capacitances that vary in increments of one hundredth of a picofarad (e.g., 0.97 pF, 0.98 pF, 0.99 pF, 1.01 pF, 1.02 pF, 1.03 pF, etc.).

In various implementations, each of primary capacitors 220 and 222 can utilize more corresponding auxiliary capacitors than shown in FIG. 9 in order to overcome more significant process dependence. Continuing the above example where the target capacitance is one picofarad (1 pF), upper and lower specification limits are plus or minus one percent (±1%) of the target capacitance, and auxiliary capacitors have nominal capacitances that vary in increments of one hundredth of a picofarad, high-yield tunable RF filter 200 can include six auxiliary capacitors (e.g., 0.97 pF, 0.98 pF, 0.99 pF, 1.01 pF, 1.02 pF, 1.03 pF) for each primary capacitor in order to account for process variations as extreme as plus or minus three percent (±3%). In contrast, if high-yield tunable RF filter 200 only included two auxiliary capacitors, high-yield tunable RF filter 200 may only account for process variations of plus or minus one percent (±1%).

Additional auxiliary capacitors can also be used to account for non-uniform process dependence. For example, a given fabrication process may exhibit more variations for larger nominal capacitances. Accordingly, high-yield tunable RF filter 200 may include two auxiliary capacitors in increments greater than the primary capacitor (e.g., 1.01 pF and 1.02 pF) but only one auxiliary capacitor less than the primary capacitor (e.g., 0.99 pF). In some implementations, two or more auxiliary capacitors corresponding to a primary capacitor can be engaged at a time. For example, two auxiliary capacitors having nominal capacitances that are forty five percent (45%) of a target capacitance can be engaged in parallel to achieve a nominal capacitance that is ninety percent (90%) of the target capacitance. The low insertion loss of PCM RF switch 225 (shown in FIG. 3) is particularly advantageous because high-yield tunable RF filter 200 can employ and engage additional auxiliary capacitors in more combinations, without insertion losses prohibiting proper RF filtering.

In one implementation, high-yield tunable RF filter 200 can utilize auxiliary capacitors to meet a certification requirement. For example, several modern processes are certified as a six sigma process. A "six sigma process" refers to a process where a mean value is six standard deviations from the nearest specification limit. For example, a process wherein a batch of fixed capacitors has a mean of one picofarad (1 pF), a standard deviation of two hundredths of a picofarad (0.02 pF), and an upper/lower specification limit of plus or minus one percent (±1%) would not be considered a six sigma process. In contrast, if the same process had a standard deviation of one hundredth of a picofarad (0.01 pF), it would be considered a six sigma process.

In a batch of high-yield tunable RF filters 200, the mean and standard deviation of all primary capacitors 220 and 222 can be measured as part of a production yield test. Where the standard deviation of primary capacitors 220 and 222 is too large for a six sigma process, some or all of primary capacitors 220 and 222 can be disengaged and substituted with auxiliary capacitors 221a, 221b, 223a, and 223b, such that the batch of RF filters 200 has a new mean and a new standard deviation for its engaged capacitors. Thus, high-yield tunable RF filters 200 enable a process that would otherwise not reach six sigma classification to do so.

In one implementation, the nominal capacitances of auxiliary capacitors 221a, 221b, 223a, and 223b are chosen such that their differences from the nominal capacitances of their corresponding primary capacitors 220 and 222 are integer multiples of the standard deviation. For example, where primary capacitors 220 and 222 have a mean capacitance of one picofarad (1 pF) and a standard deviation of two hundredths of a picofarad (0.02 pF), auxiliary capacitors may have nominal capacitances that vary in increments of two hundredths of a picofarad (e.g., 0.94 pF, 0.96 pF, 0.98 pF, 1.02 pF, 1.04 pF, 1.06 pF, etc.). In one approach, the actual deviation of a primary capacitor from the mean is first measured, and then the primary capacitor is substituted with an auxiliary capacitor corresponding to that deviation. For example, a primary capacitor that deviates between plus one standard deviation and plus two standard deviations (e.g., between 1.02 pF and 1.04 pF) can be substituted with an auxiliary capacitor whose nominal capacitance correspond to minus one standard deviation (e.g., 0.98 pF), while another primary capacitor that deviates between plus two standard deviations and plus three standard deviations (e.g., between 1.04 pF and 1.06 pF) can be substituted with an auxiliary capacitor whose nominal capacitance correspond to minus two standard deviations (e.g., 0.96 pF).

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A high-yield tunable radio frequency (RF) filter comprising:
   a plurality of process-dependent capacitors;
   a plurality of non-volatile RF switches, wherein each of said plurality of process-dependent capacitors is connected to at least one of said plurality of non-volatile RF switches;
   wherein said at least one of said plurality of non-volatile RF switches is a phase-change material (PCM) RF switch including a PCM and a heating element underlying said PCM;
   first electrical connectors above said PCM coupled to said PCM;
   second electrical connectors below said heating element coupled to said heating element;
   an auxiliary capacitor in said plurality of process-dependent capacitors being engaged by an ON-state non-volatile RF switch in said plurality of non-volatile RF switches;
   a primary capacitor in said plurality of process-dependent capacitors being disengaged by an OFF-state non-volatile RF switch in said plurality of non-volatile RF switches.

2. The high-yield tunable RF filter of claim 1, wherein said PCM RF switch further comprises a contact uniformity support layer situated on said PCM.

3. The high-yield tunable RF filter of claim 1, wherein said heating element is transverse to said PCM, said heating element approximately underlying an active segment of said PCM.

4. The high-yield tunable RF filter of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

5. The high-yield tunable RF filter of claim 1, wherein said PCM RF switch further comprises PCM contacts situated on top of passive segments of said PCM and not situated on sides of said PCM;
   wherein said heating element is transverse to said PCM such that said PCM contacts situated on top of said passive segments of said PCM do not overlie said heating element.

6. The high-yield tunable RF filter of claim 1, wherein said auxiliary capacitor engaged by said ON-state non-volatile RF switch causes said high-yield tunable RF filter to substantially reject an undesired frequency and to substantially admit a desired frequency.

7. The high-yield tunable RF filter of claim 6, wherein said desired frequency corresponds to a first wireless communication standard and said undesired frequency corresponds to a second wireless communication standard.

8. The high-yield tunable RF filter of claim 6, wherein said desired frequency is between approximately 2.1 GHz and approximately 2.5 GHz, and said undesired frequency is between approximately 3.3 GHz and approximately 5.8 GHz.

9. The high-yield tunable RF filter of claim 1, wherein said auxiliary capacitor is approximately ten percent (10%) greater than said primary capacitor.

10. The high-yield tunable RF filter of claim 1, wherein said auxiliary capacitor is approximately ten percent (10%) less than said primary capacitor.

11. The high-yield tunable RF filter of claim 1, wherein said plurality of process-dependent capacitors comprise a parallel plate capacitor.

12. The high-yield tunable RF filter of claim 1, wherein said plurality of process-dependent capacitors comprise a metal-insulator-metal (MIM) capacitor formed with a top capacitor plate and a high-k film below said top capacitor plate, wherein an interconnect metal is a bottom capacitor plate.

13. The high-yield tunable RF filter of claim 1, wherein said plurality of process-dependent capacitors comprise a vertical metal-oxide-metal (MOM) capacitor, wherein a first interconnect metal is a bottom capacitor plate, and a second interconnect metal is a top capacitor plate.

14. A high-yield tunable radio frequency (RF) filter comprising:
   a plurality of capacitors;
   a plurality of non-volatile RF switches, wherein each of said plurality of capacitors is connected to at least one of said plurality of non-volatile RF switches;
   wherein said at least one of said plurality of non-volatile RF switches is a phase-change material (PCM) RF switch including a PCM and a heating element underlying said PCM;
   first electrical connectors above said PCM coupled to said PCM;
   second electrical connectors below said heating element coupled to said heating element;
   a first capacitor in said plurality of capacitors engaged by a first non-volatile RF switch in said plurality of non-volatile RF switches;
   a second capacitor in said plurality of capacitors disengaged by a second non-volatile RF switch in said plurality of non-volatile RF switches.

15. The high-yield tunable RF filter of claim 14, wherein said PCM RF switch further comprises a contact uniformity support layer situated on said PCM.

16. The high-yield tunable RF filter of claim 14, wherein said heating element is transverse to said PCM, said heating element approximately underlying an active segment of said PCM.

17. The high-yield tunable RF filter of claim 14, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

18. The high-yield tunable RF filter of claim 14, wherein each of said PCM RF switches further comprises PCM contacts situated on top of passive segments of said PCM and not situated on sides of said PCM;
   wherein said heating element is transverse to said PCM such that said PCM contacts situated on top of said passive segments of said PCM do not overlie said heating element.

19. The high-yield tunable RF filter of claim 14, wherein said first capacitor engaged by said first non-volatile RF switch causes said high-yield tunable RF filter to substantially reject an undesired frequency and to substantially admit a desired frequency.

* * * * *